United States Patent [19]

Nishina et al.

[11] Patent Number: 5,503,964
[45] Date of Patent: Apr. 2, 1996

[54] RESIST REMOVING METHOD

[75] Inventors: Tatsushi Nishina; Takafumi Maeda; Shin Hasebe, all of Kariya, Japan

[73] Assignee: Kabushiki Kaisha Toyoda Jidoshokki Seisakusho, Kariya, Japan

[21] Appl. No.: 174,621

[22] Filed: Dec. 28, 1993

Related U.S. Application Data

[63] Continuation of Ser. No. 891,414, May 29, 1992, abandoned.

[30] Foreign Application Priority Data

May 30, 1991 [JP] Japan ..................................... 3-127834

[51] Int. Cl.$^6$ ..................................................... G03F 7/42
[52] U.S. Cl. ........................... 430/329; 430/311; 430/328; 430/330; 134/1; 134/902; 437/16; 437/20
[58] Field of Search ..................... 430/311, 315, 430/328, 329, 330, 331; 134/1, 4, 902; 437/16, 20, 30

[56] References Cited

U.S. PATENT DOCUMENTS

| | | | |
|---|---|---|---|
| 4,548,688 | 10/1985 | Matthews | 204/159.18 |
| 4,826,756 | 5/1989 | Orvek | 430/328 |
| 4,861,732 | 8/1989 | Fujimura et al. | 437/229 |
| 4,938,839 | 7/1990 | Fujimura et al. | 156/628 |
| 5,114,529 | 5/1992 | Masuyama | 156/643 |

FOREIGN PATENT DOCUMENTS

| | | |
|---|---|---|
| 0304068 | 2/1989 | European Pat. Off. . |
| 0386609 | 9/1990 | European Pat. Off. . |
| 8705314 | 9/1987 | WIPO . |

*Primary Examiner*—Kathleen Duda
*Attorney, Agent, or Firm*—Brooks Haidt Haffner & Delahunty

[57] ABSTRACT

This resist removing method realizes efficient production of semiconductor devices and is configured to ensure both safe production and reliable semiconductor devices.

The present invention can be applied to a resist removing method used in combination with a high dose of ions injection process of applying a high dose of impurity ions to a semiconductor wafer onto which surface a far-ultraviolet-ray hardened resist is partially applied. That is, the present invention comprises a resist hardening step of evenly hardening the resist by treating it in a far-ultraviolet-ray irradiation process and a baking process before a high dose of ions injection process. Additionally, it comprises a resist ashing step of removing the resist by forcing the resist to react under the pressure of 2 through 5 Torr to $O_2$ plasma excited by a microwave after the high dose of ions injection process.

8 Claims, 5 Drawing Sheets

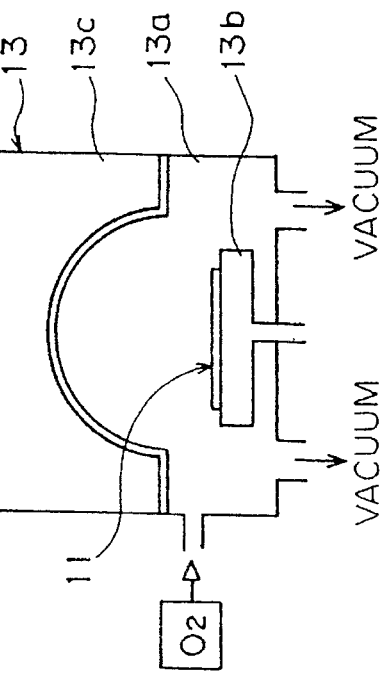
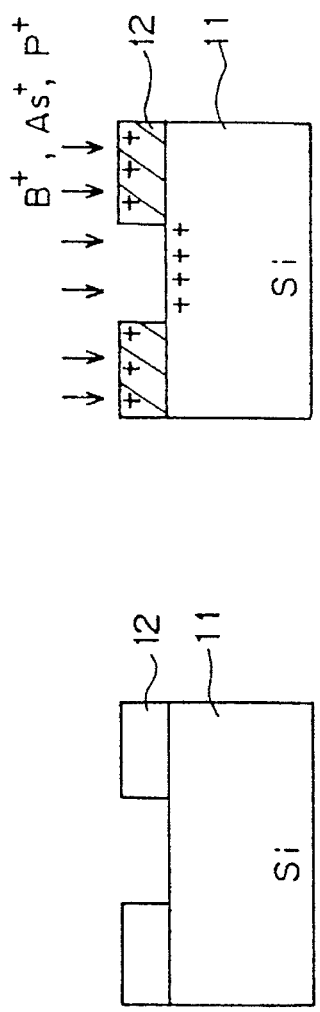
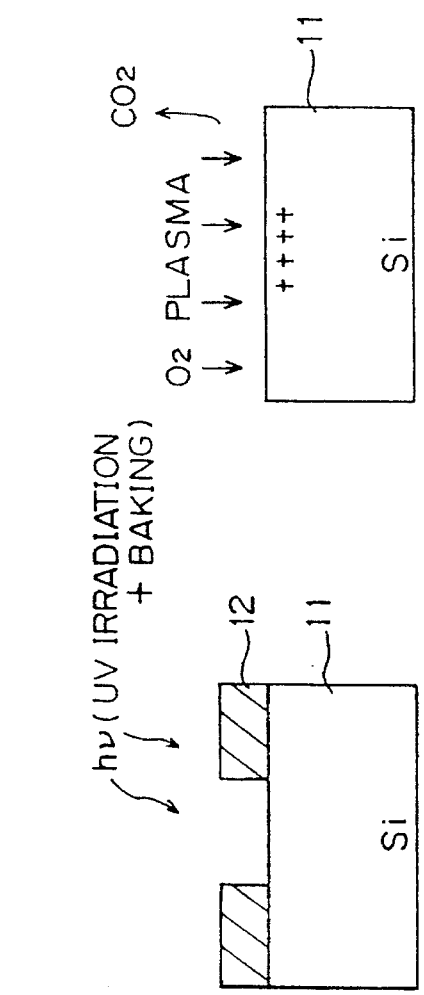

RESIST REMOVING METHOD

This application is a continuation of application Ser. No. 07/891,414, filed May 29, 1992, now abandoned.

BACKGROUND OF THE INVENTION

The present invention relates to a resist removing method, and specifically to a method of efficiently removing a resist which contains a high concentration of impurities and is applied before the injection of a high dose of ions onto a semiconductor wafer.

Generally, in the production of semiconductor devices, a high dose of ions is injected to some portions of a semiconductor wafer for the purpose of forming a highly conductive semiconductor area, etc. In this case, a resist is applied onto the surface of the semiconductor wafer to mask the area where the high dose of ions is not required, but the resist composition is often deteriorated badly. Therefore, conventional methods of removing the deteriorated resist composition in an aftertreatment cannot efficiently remove it only by a chemical reaction using $0_2$ plasma (oxygen gas plasma). Especially when the dose amounts to $1 \times 10^{15}$ ions/cm$^2$ or more, the resist composition cannot be removed efficiently, thereby resulting in defective removal.

Conventionally, to avoid the above described problems, the following methods are used to remove a resist composition. For example, 1. A method of accelerating the reaction of a resist with the $O_2$ plasma by mixing $H_2$ (hydrogen gas).
2. A method of accelerating the reaction of a resist with the $O_2$ plasma, etc. by applying a high frequency electric field to a semiconductor wafer.
3. A method of forcing UV ozone obtained by the irradiation of the $O_2$ plasma with far ultraviolet rays to react with a resist.

FIGS. 1A through 1D show processes for explaining the conventional resist removing methods in which both the above described method 1 of mixing $H_2$ and method 2 of applying a high frequency electric field are used in combination.

As shown in 1A, a resist 2 is selectively applied to the surface of a semiconductor wafer 1 made of such materials as Si (silicon) except areas where high dose of ions is injected.

Next, as shown in 1B, p-type impurities such as B (boron) and n-type impurities such as As (arsenic) or P (phosphorus) are injected in high density (represented by "+" in FIG. 1B) at a high temperature atmosphere above the semiconductor wafer 1 to which the resist 2 is selectively applied. High dose of ions is injected onto the exposed areas of the surface of the semiconductor wafer 1, that is, areas not covered with the resist 2. Simultaneously, the high dose of ions is injected onto the resist 2 itself, thereby causing the deterioration of the composition of the resist 2.

Next, as shown in FIG. 1C, the semiconductor wafer 1 to which the high dose of ions was injected is provided with the mixed gas of $O_2$ and $H_2$. Then, the resist 2 applied onto the semiconductor wafer 1 under the influence of a high frequency electric field (described later), chemically reacts with the mixed gas of $O_2$ and $H_2$, and is finally decomposed to $CO_2$ (carbon dioxide) and $H_2O$ (water).

As shown in FIG. 1D, the resist 2 selectively applied onto the surface of the semiconductor wafer 1 can be removed using a microwave ashing system 3. That is, the semiconductor wafer 1 is mounted on a sample table 3b provided inside a chamber 3a of the microwave ashing system 3, and supplied with a high frequency electric field by a high frequency power source 3c (oscillation frequency of 13.56 MHz). In the chamber 3a, the mixed gas of $O_2$ and $H_2$ introduced to the chamber 3a is excited by the microwave (oscillation frequency of 2.45 GHz) introduced from a directing chamber 3d. As a result, $O_2$ and $H_2$ are changed to $O_2$ plasma (including oxygen radicals, etc.) and $H_2$ plasma respectively. The resultant plasma is attracted to the semiconductor wafer 1 by the influence of the high frequency electric field generated by the high frequency power source 3c, and actively reacts with the component of the resist 2.

Thus, in the above described process, the composition of the resist 2 is forced to chemically react with the actions of $H_2$ and the high frequency electric field although the composition of the resist 2 selectively applied onto the surface of the semiconductor 1 is badly deteriorated by the injection of the high dose of ions. As a result, the resist 2 can be efficiently removed from the semiconductor wafer 1, thereby preventing defective removal.

Although the resist removing method shown in FIG. 1A to 1D enables the resist 2 to be efficiently removed from the semiconductor wafer 1, there are the following problems with the method.

1. The mixed gas of $O_2$ and $H_2$ may easily cause an explosion depending on its mixing ratio.
2. The high frequency electric field applied to the semiconductor wafer 1 admits no physical or mechanical faults in the semiconductor wafer 1.
3. In the method in which UV ozone reacts with the resist, the resist 2 cannot be removed as efficiently as shown in FIG. 1A to 1D. Therefore, in an aftertreatment, the residual resist must be removed by a wet etching process. This cannot avoid the reduction of insulation films such as thermal oxidation films applied on the surface of a semiconductor wafer. That is, the conventional resist removing methods still have problems in safe production (refer to 1 above) and reliable semiconductor devices (refer to 2 and 3 above).

SUMMARY OF THE INVENTION

The present invention has been developed based on the above described background. An object of the present invention is to ensure both safe production and reliable semiconductor devices.

The present invention can be applied to a resist removing method used in combination with a high dose of ions injection process of applying a high dosage impurity to a semiconductor wafer onto which surface a far-ultraviolet-ray hardened resist is selectively applied. That is, the present invention comprises a resist hardening step of evenly hardening the resist by treating it with a far-ultraviolet-ray irradiation process and a baking process before performing a high dose of ions injection process. Additionally, it comprises a resist ashing step of removing the resist by forcing the resist to react under the pressure of 2 through 5 Torr to $O_2$ plasma excited by a microwave after the high dose of ions injection process.

With the above described configuration, the heat-resistance of the resist is improved up to 300° C. so that the resist can sufficiently resist a heat treatment in the following high dose of ions injection process by evenly hardening the resist in the resist hardening process. Then, after performing the high dose of ions injection process on a semiconductor wafer, the resist is removed in the resist ashing process in which the resist is forced to react under the pressure of 2 through 5 Torr to $O_2$ plasma excited by a microwave. During the processes above, $H_2$ is not used or a high frequency electric field is not applied to the semiconductor wafer. Therefore, the processes can be performed safely and a semiconductor can be produced with high reliability.

BRIEF DESCRIPTION OF THE DRAWINGS

An object and feature of the present invention can be easily recognized by referring to the attached drawings and the description of the preferred embodiments of the present invention.

FIG. 2A to 2E show a process of the resist removing method applied to an embodiment of the present invention;

DESCRIPTION OF THE PREFERRED EMBODIMENT

Figure 1D:
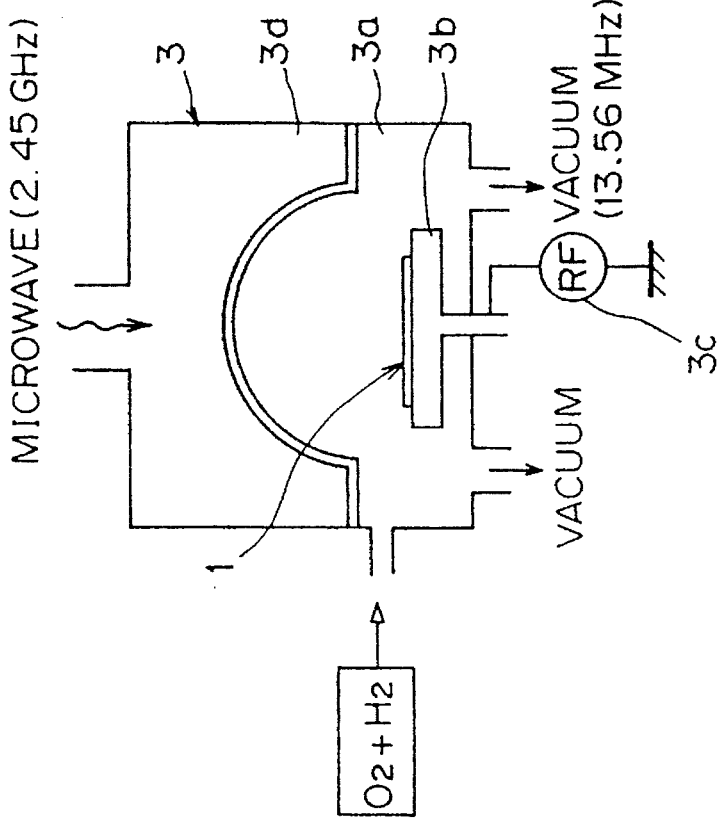
FIG. 1A to 1D shows a process of a conventional resist removing method comprising both a step of mixing $H_2$ and a step of applying a high frequency electric field.
Figure 1A:
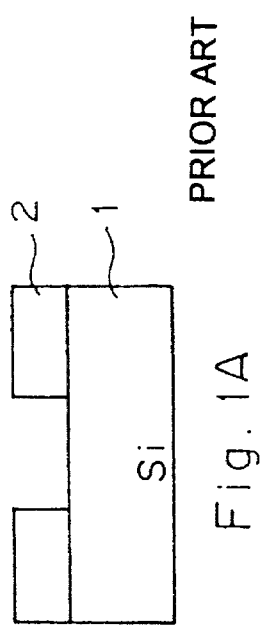
Figure 1B:
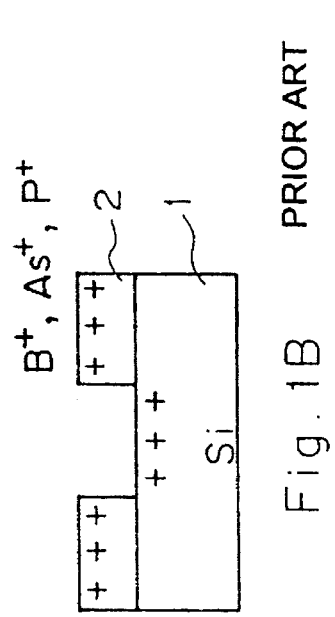
Figure 1C:
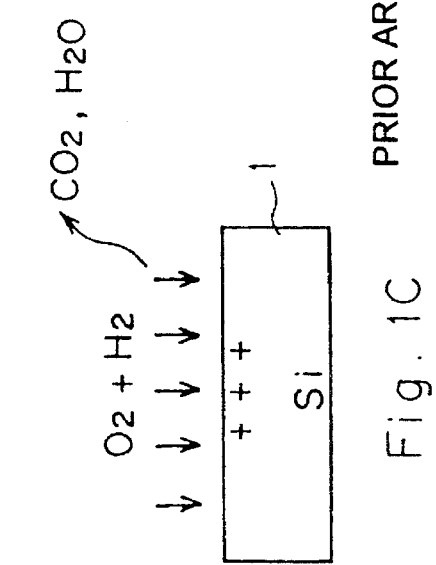

FIGS. 2A–2D show processes of the resist removing method applied to an embodiment of the present invention.

As shown in FIG. 2A, a far-ultraviolet-ray hardened resist 12 is selectively applied onto the surface of a semiconductor wafer 11 made of Si, etc. excepting the areas where high dose of ions must be injected. For example, the resist is composed of positive type novolak materials, and the thickness of its film is 5 μm at the maximum.

Next, as shown in FIG. 2B (resist hardening process), a far-ultraviolet-ray irradiation process (hereinafter referred to as "UV irradiation") and a baking process (hereinafter referred to as "baking") are performed on the far-ultraviolet-ray hardened resist 12 selectively applied onto the surface of the semiconductor wafer 11. That is, in this embodiment, while the resist is irradiated with the far-ultraviolet-ray for 80 seconds, the temperature is raised from 120° C. to 200° C. linearly. In other case, the resists are raised up to 250° C. The far-ultraviolet-ray hardened resist 12 is hardened by receiving an energy hv [J] per photon obtained from the UV irradiation (where h indicates a Planck's constant; and v indicates a specific frequency of far ultraviolet rays). Then, the resist 12 can be hardened actively by volatilizing a volatile solvent contained in the resist 12 by a baking at about 200° C. Therefore, the UV irradiation and the baking processes work more effectively when performed simultaneously. By performing these processes, the far-ultraviolet-ray resist 12 is hardened evenly from the surface through its entire depth, and the heat-resistance is improved up to 300° C.

Next, as shown in FIG. 2C (high dose of ions injection process), p-type impurities such as B (boron) and n-type impurities such as As (arsenic) or P (phosphorus) are injected in high density (represented by "+" in FIG. 2C) in a high temperature atmosphere from above onto the semiconductor wafer 11 on which the resist 12 is hardened. High dose of ions is injected onto the exposed areas, that is, areas not covered with the resist 12, of the surface of the semiconductor wafer 11. The dose amounts to, for example, about $1\times10^{15}$ ions/cm$^2$ in consideration of the efficiency of the following ashing system. Simultaneously, the high dose of ions is injected onto the resist 12 itself. Since the resist 12 is hardened in the previous resist hardening process and its heat-resistance is improved up to about 300° C., the resist composition is not badly deteriorated by the high dose of ions injection in the high temperature atmosphere.

Next, as shown in FIG. 2D (resist ashing process), the semiconductor wafer 11 to which the high dose of ions was injected is provided with $O_2$ plasma. Then, the hardened resist 12 applied onto the semiconductor wafer 11 chemically reacts with $O_2$ plasma in the high temperature atmosphere of 100°–200° C., and is decomposed to $CO_2$ (carbon dioxide).

As shown in FIG. 2E, the resist 12 selectively applied onto the surface of the semiconductor wafer 11 can be removed using a plasma ashing system 13 excited by microwaves. That is, the semiconductor wafer 11 is mounted on a sample table 13b provided inside a chamber 13a which is set under a predetermined pressure. $O_2$ given to this chamber 13a is excited by a predetermined microwave (oscillation frequency of 2.45 GHz) introduced from a directing chamber 13c. As a result, $O_2$ is changed to $O_2$ plasma. The resultant $O_2$ plasma normally reacts with the component of the resist 12 hardened on the surface of the semiconductor wafer 11 mounted on the sample table 13b. Thus, the resist 12 is removed successfully.

The pressure inside the chamber 13a in the microwave ashing system 13 and the output of a microwave are parameters for determining the removal efficiency of the resist 12 after being hardened on the semiconductor wafer 11. Given below are actual values indicating the removal efficiency of the resist 12 when the pressure inside the chamber 13a and the output of a microwave are varied. There are preconditions as follows: 1.27 μm film thickness of the resist 12; 200° C. baking temperature for the hardening of the resist; $1\times10^{16}$ ions/cm$^2$ dose of B at the injection of high dose of ions; 250 cc/min. supply of $O_2$ during the ashing of the resist; and 180° C. temperature inside the chamber 13a during the ashing of the resist.

Figure 3:
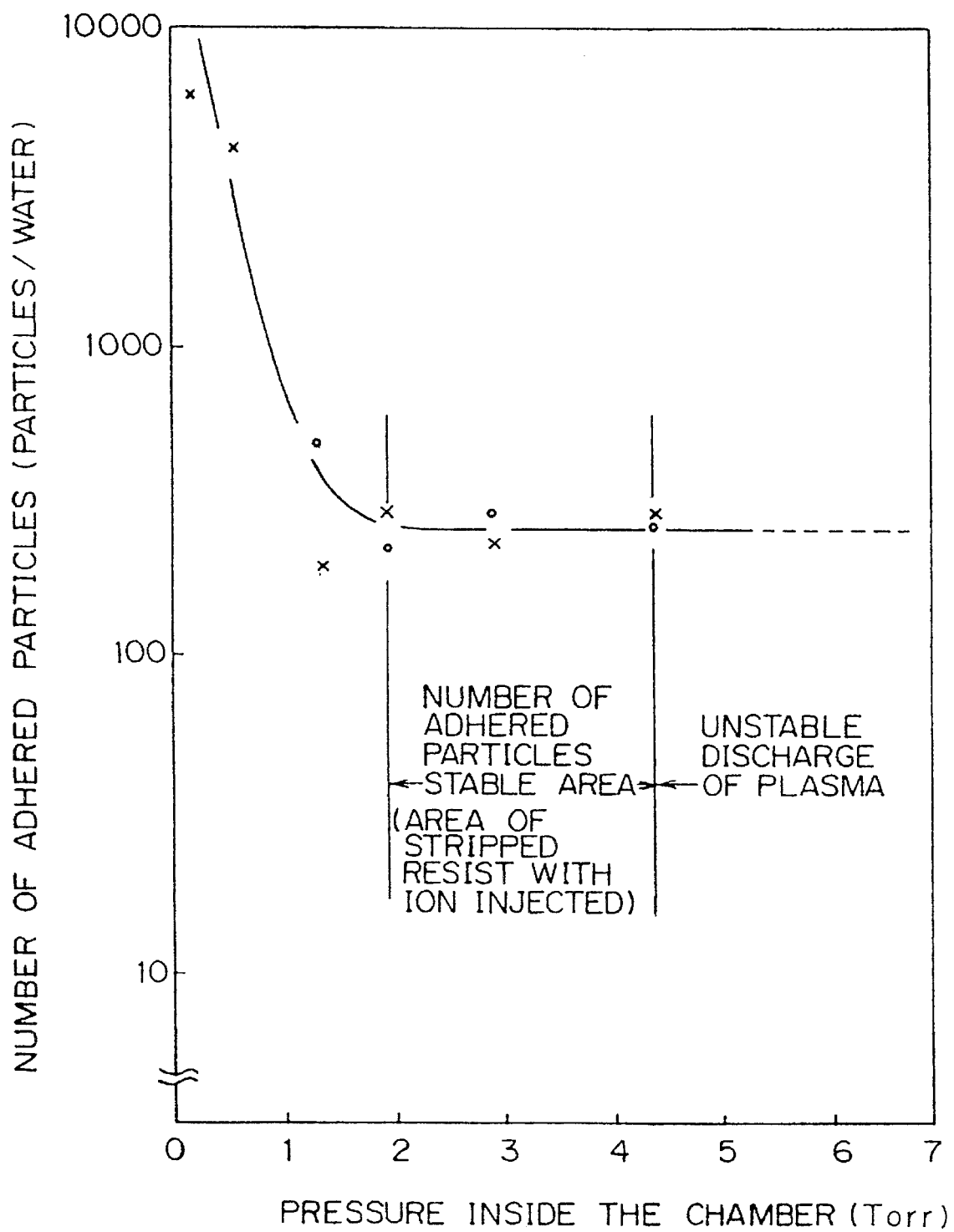
FIG. 3 shows the variation of the number of adhered particles when the pressure in the chamber is varied with the output of a microwave fixed to a predetermined value.

FIG. 3 shows variations of the number of adhered particles when the output of a microwave is fixed to a predetermined value and the pressure is varied inside the chamber 13a. The measured particles are 2 μm or more across and the number of adhered particles are on the 4 inch semiconductor wafer 11.

As shown in FIG. 3, the number of particles adhered on the surface of the semiconductor wafer 11 amounts to 10000 particles/wafer at the pressure of nearly 0 Torr inside the chamber 13a when the output of a microwave is fixed to 800 W (indicated by the mark "x" in FIG. 3). When the pressure inside the chamber 13a is gradually increased and set in the range of 2 to 5 Torr, a specific area can be obtained where the number of adhered particles is stable around 100 particles/wafer, that is, the optimum area for stripping (removing) the resist 12 after the injection of high dose of ions can be determined. When the pressure inside the chamber 13a exceeds 5 Torr, the discharge of plasma becomes unstable, which is inappropriate for stripping the resist 12. Likewise, a stable area can be determined where the number of adhered particles is about 100 particles/wafer under the pressure of 2 to 5 Torr when the output of a microwave is fixed to 1,000 W (shown with the mark "." in FIG. 3). Accordingly, it can be concluded that the number of particles adhered to the surface of the semiconductor wafer 11 depends on the pressure inside the chamber 13a, not on the output of a microwave, and that the pressure inside the chamber 13a should be set within the range of 2–5 Torr. The optimum range is 3–4 Torr. The minimum value is 1 Torr with a deteriorated stripping function, though.

Figure 4:
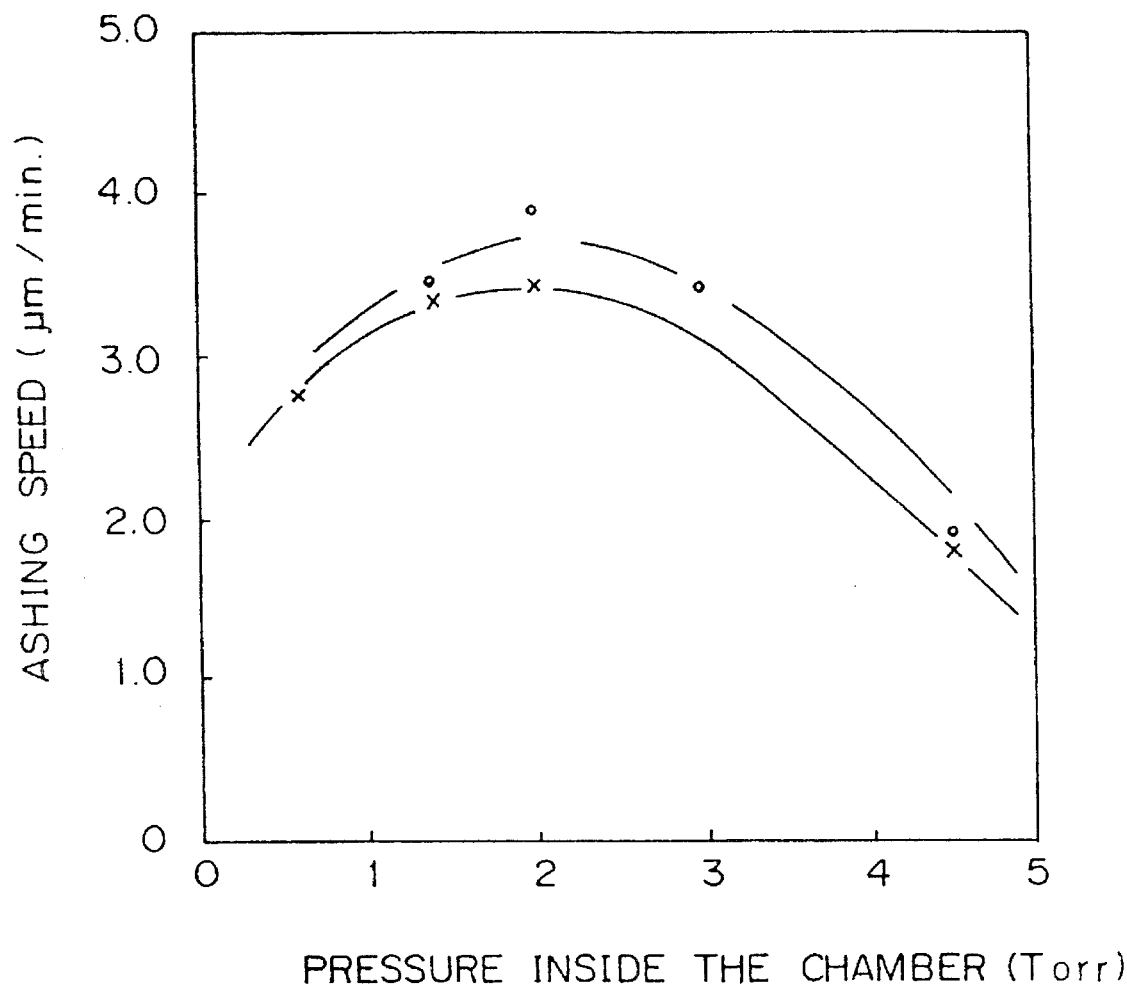
FIG. 4 shows the variation of the resist ashing speed, when the pressure in the chamber is varied, with the output of a microwave fixed to a predetermined value.

FIG. 4 shows the variation of the ashing speed of the resist 12 when the pressure inside the chamber 13a is varied with the output of a microwave fixed to a predetermined value.

As shown in FIG. 4, the ashing speed reaches the maximum level over 3 μm/min. under the pressure of 2 Torr. when the output of a microwave is fixed to 800 W (indicated with the marks "x" in FIG. 4) and the pressure inside the chamber 13a is gradually increased from 0 Torr. Then, the ashing speed stops increasing under the pressure of 2 Torr even though the pressure inside the chamber 13a is increased. A similar result can be obtained when the output of a microwave is fixed to 1,000 W (indicated by the marks "." in FIG. 4). That is, the ashing speed reaches the maximum level of nearly 4 μm/min. under the pressure of 2 Torr, and the speed is a little faster than at the output of a microwave of 800 W. Therefore, the ashing speed of the resist 12 monotonically increases with the output of a microwave.

Figure 5:
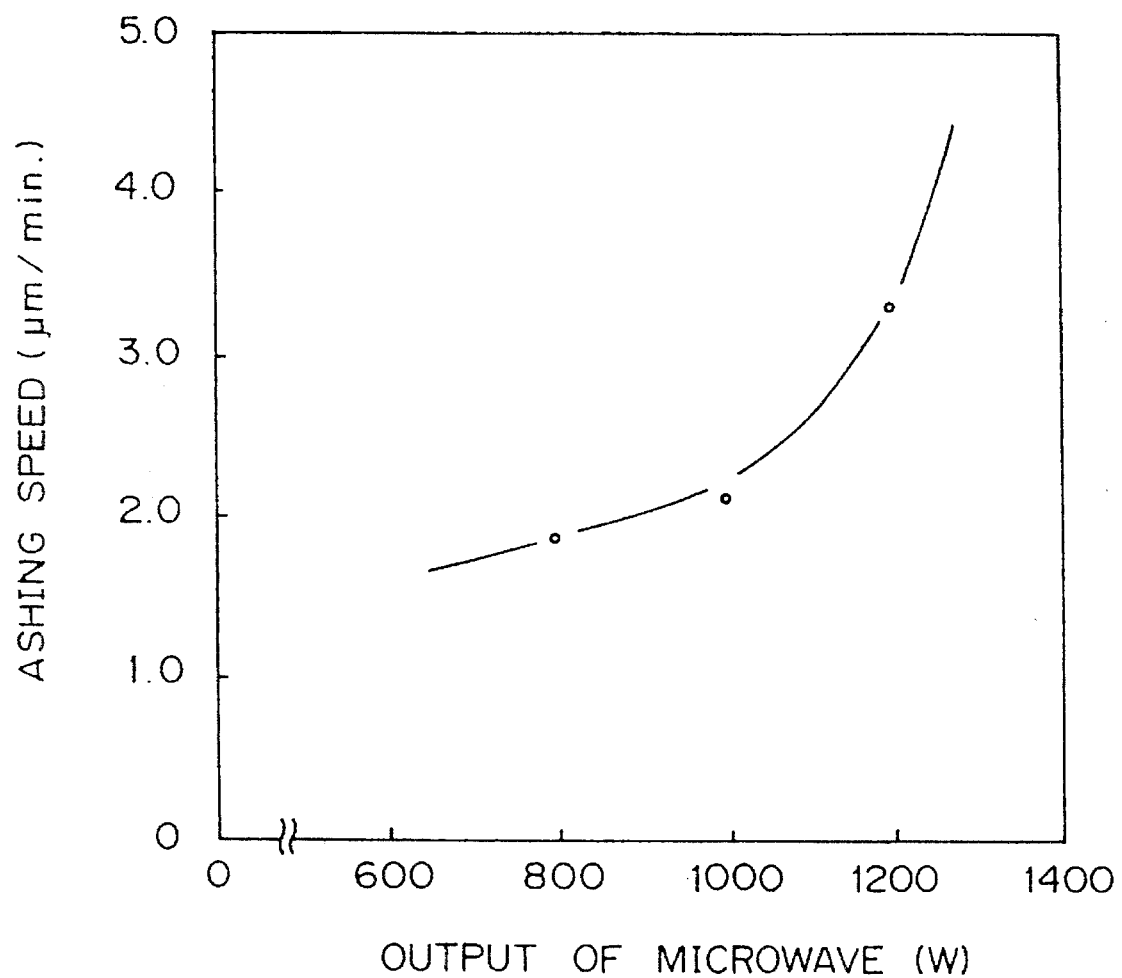
FIG. 5 shows the variation of the resist ashing speed, when the output of a microwave is varied with the pressure in the chamber fixed to a predetermined value.

FIG. 5 shows the variation of the ashing speed of the resist 12 when the output of a microwave is varied, with the pressure inside the chamber 13a fixed to a predetermined value.

As shown in FIG. 5, the ashing speed when the output of the microwave is 800 W is about 2 μm/min. This is almost the same as the ashing speed when the output of the microwave is 1000 W if the pressure inside the chamber 13a is fixed to a predetermined value (4.5 Torr in this case) and the output of a microwave is gradually increased (refer to FIG. 4). However, if the output of a microwave is increased to 1200 W, the ashing speed exceeds 3 μm/min. even though the pressure inside the chamber 13a indicates 4.5 Torr. As a result, the ashing speed of the resist 12 monotonically increases with the output of a microwave.

According to the above described actual values, the pressure inside the chamber 13a should be in the range of 2 to 5 Torr (preferably 3–4 Torr) in order to efficiently remove, using the microwave ashing system 13, the resist 12 on the surface of the semiconductor wafer 11 in the resist ashing process. On this condition, the output of a microwave must be increased to the highest possible value if the ashing speed of the resist 12 is required to be increased. In addition to the above described embodiment realized with a plasma ashing system, another embodiment can be realized with a device operated using a high frequency. However, since a high-frequency device often varies the pressure, which causes a reaction of $O_2$ plasma, it has a problem that the optimum pressure cannot be specified easily.

As described above, the present invention realizes safe production and high reliability in producing semiconductors because $H_2$ is not used or a high frequency electric field is not applied onto a semiconductor wafer. Besides, a resist can be removed easily at a high speed after the injection of high dose of ions even though $H_2$ is not used or a high frequency electric field is not applied onto a semiconductor wafer. Thus, semiconductor devices can be made using the above described semiconductor wafers with an excellent yield and efficiency.

The present invention is not limited to the above described embodiment, but applicable to a number of variations based on its principle.

What is claimed is:

1. A method of producing a semiconductor wafer with highly conductive semiconductor areas comprising in combination the steps of:

forming on a surface of a semiconductor substrate a mask layer of a resist material hardenable under far-ultraviolet-ray irradiation to mask those areas that are not to become highly conductive;

subjecting said layer of resist material to heat and far-ultraviolet-ray irradiation to evenly harden said resist material and thereby increase the heat resistance of said resist material to about 300° C.;

then applying heat below about 300° C. and exposing the masked surface of the substrate to impurity ion injection at a density of at least $1 \times 10^{15}$ ions/cm$^2$ to develop in the unmasked areas said highly conductive areas;

and thereafter removing said resist material by an ashing process in which said resist material layer is exposed to an $O_2$ plasma excited by microwaves in a high temperature atmosphere under 2 to 5 Torr pressure to cause decomposition of the resist material.

2. The method according to claim 1, wherein:

the oscillation frequency of said microwaves is 2.45 GHz.

3. The method according to claim 1, wherein said ion injection density is about $1 \times 10^{15}$ to $1 \times 10^{16}$ ions/cm$^2$.

4. A method of producing a semiconductor wafer with highly conductive semiconductor areas comprising in combination the steps of:

forming on a surface of a semiconductor substrate a mask layer of a resist material hardenable under far-ultraviolet-ray irradiation to mask those areas that are not to become highly conductive; subjecting said layer of resist material to heat within the range extending from above 120° C. up to 250° C. and to far-ultraviolet-ray irradiation to evenly harden said resist material and thereby increase the heat resistance of said resist material to a predetermined level;

then applying heat below said predetermined level and exposing the masked surface of the substrate to impurity ion injection at a density of at least $1 \times 10^{15}$ ions/cm$^2$ to develop in the unmasked areas said highly conductive areas; thereafter removing said resist material by an ashing process in which said resist material layer is exposed to an $O_2$ plasma excited by microwaves in a high temperature atmosphere under 2 to 5 Torr pressure to cause decomposition of the resist material.

5. The method according to claim 4, wherein the oscillation frequency of said microwaves is 2.45 GHz.

6. The method according to claim 4, wherein said predetermined level is about 300° C.

7. The method according to claim 6, wherein said ion injection density is about $1 \times 10^{15}$ to $1 \times 10^{16}$ ions/cm$^2$.

8. The method according to claim 4, wherein said ion injection density is about $1 \times 10^{15}$ to $1 \times 10^{16}$ ions/cm$^2$.

* * * * *